(12) United States Patent
Sherrod et al.

(10) Patent No.: US 8,982,565 B2
(45) Date of Patent: Mar. 17, 2015

(54) TOOLLESS CONFIGURATION OF A COMPUTER ENCLOSURE

(75) Inventors: David W. Sherrod, Houston, TX (US); Michael E. Taylor, Houston, TX (US); Joseph R. Allen, Tomball, TX (US); John P. Franz, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1482 days.

(21) Appl. No.: 12/121,350

(22) Filed: May 15, 2008

(65) Prior Publication Data

US 2008/0310123 A1    Dec. 18, 2008

Related U.S. Application Data

(60) Provisional application No. 60/943,417, filed on Jun. 12, 2007.

(51) Int. Cl.
| | | |
|---|---|---|
| *H05K 5/00* | (2006.01) | |
| *H05K 7/00* | (2006.01) | |
| *A45D 19/04* | (2006.01) | |
| *G11B 33/02* | (2006.01) | |
| *H05K 7/14* | (2006.01) | |

(52) U.S. Cl.
CPC .................................. *H05K 7/1488* (2013.01)
USPC ........... 361/725; 361/726; 361/727; 361/728; 361/729; 361/730; 361/731; 361/732; 248/155.5; 369/75.11; 369/77.11

(58) Field of Classification Search
USPC ....................... 361/679.02, 679.39, 724–727; 312/223.1, 223.2, 265, 265.5; 211/26; 403/217; 108/61; 248/694
See application file for complete search history.

(56) References Cited

U.S. PATENT DOCUMENTS

| | | | | |
|---|---|---|---|---|
| 3,272,581 | A * | 9/1966 | Stucki | 312/234.4 |
| 3,807,572 | A * | 4/1974 | Luvara et al. | 211/10 |
| 5,877,938 | A * | 3/1999 | Hobbs et al. | 361/724 |
| 6,775,132 | B2 * | 8/2004 | Chen et al. | 361/679.33 |
| 6,904,149 | B2 * | 6/2005 | Keenum et al. | 379/445 |
| 6,912,132 | B2 | 6/2005 | Riddiford et al. | |
| 7,035,111 | B1 | 4/2006 | Lin et al. | |
| 7,065,599 | B2 | 6/2006 | King et al. | |
| 2007/0095774 | A1 * | 5/2007 | Canfield et al. | 211/189 |
| 2007/0174850 | A1 | 7/2007 | El Zur | |

FOREIGN PATENT DOCUMENTS

| | | |
|---|---|---|
| GB | 378822 | 2/2003 |
| GB | 2379091 | 2/2003 |
| GB | 2379092 | 2/2003 |
| WO | 2006095338 | 9/2006 |
| WO | 2007084422 | 7/2007 |

* cited by examiner

*Primary Examiner* — Jerry Wu
(74) *Attorney, Agent, or Firm* — Thomas Horstemeyer, LLP

(57) ABSTRACT

Included are embodiments for toolless configuration of a computer enclosure. At least one embodiment of an apparatus includes a computer enclosure configured to support a plurality of components, the computer enclosure including a plurality of dividing walls, the dividing walls including a first opening and a second opening. Some embodiments include a divider configured for insertion into the computer enclosure and between the dividing walls, the divider including a first tab for coupling with the first opening, the divider including a second tab for coupling with the second opening, the divider further including a locking tab for locking the divider in place within the computer enclosure.

10 Claims, 17 Drawing Sheets

TOOLLESS CONFIGURATION OF A COMPUTER ENCLOSURE

CROSS REFERENCE

This application claims the benefit of U.S. Provisional Application No. 60/943,417, filed Jun. 12, 2007, which is incorporated by reference in its entirety.

BACKGROUND

As computing technologies have advanced, users have developed a desire for additional computing power in a lower volume of space, often described as densification. In a blade server environment, the number of blade servers supported by a single computer enclosure (speaking in terms of space constraints) may present problems in that oftentimes blade servers in the computer enclosure may be difficult to rearrange, alter, and/or otherwise reconfigure based on the increased need for computational power and the reduced space requirements.

SUMMARY

Included are embodiments for toolless configuration of a computer enclosure. At least one embodiment of an apparatus includes a computer enclosure configured to support a plurality of components, the computer enclosure including a plurality of dividing walls, the dividing walls including a first opening and a second opening. Some embodiments include a divider configured for insertion into the computer enclosure and between the dividing walls, the divider including a first tab for coupling with the first opening, the divider including a second tab for coupling with the second opening, the divider further including a locking tab for locking the divider in place within the computer enclosure.

Also included are embodiments of a method. At least one embodiment of a method includes inserting a divider into a computer enclosure at an axial angle, the divider including a first tab and a second tab, the computer enclosure including a first opening and a second opening and coupling a first tab with the first opening and aligning the second tab with the second opening. Some embodiments include axially rotating the divider to couple the second tab with the second opening and locking the divider in place within the computer enclosure.

Other embodiments and/or advantages of this disclosure will be or may become apparent to one with skill in the art upon examination of the following drawings and detailed description. It is intended that all such additional systems, methods, features, and advantages be included within this description and be within the scope of the present disclosure.

BRIEF DESCRIPTION

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, there is no intent to limit the disclosure to the embodiment or embodiments disclosed herein. On the contrary, the intent is to cover all alternatives, modifications, and equivalents.

Figure 7A:
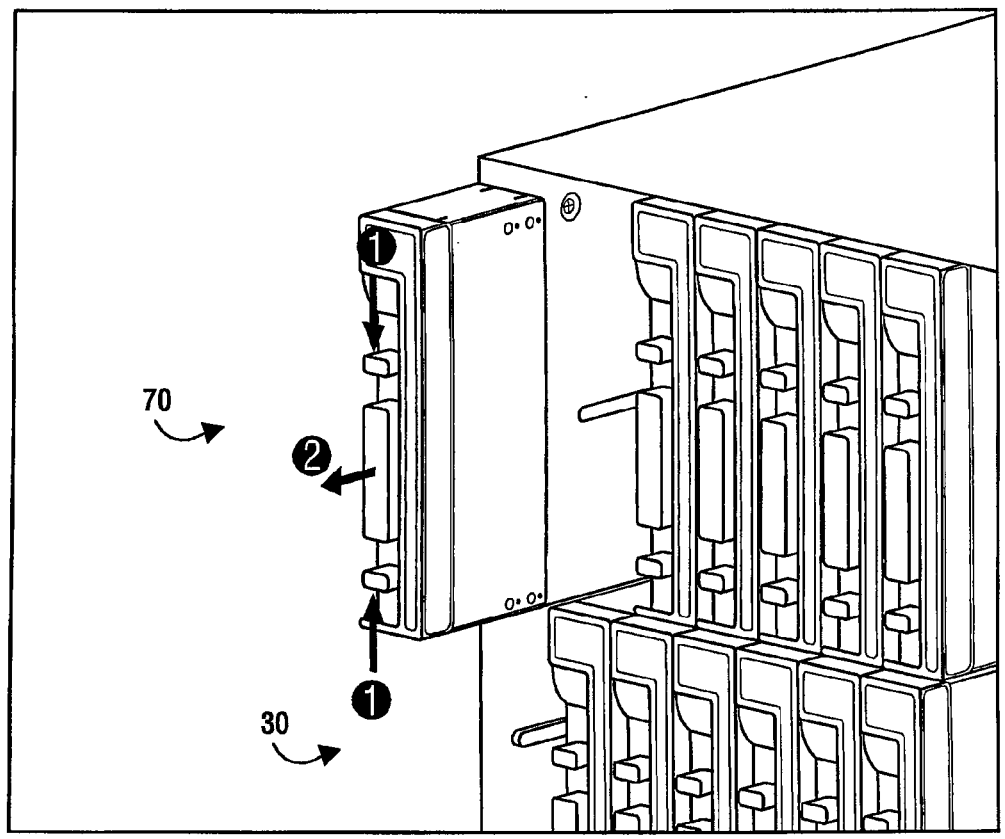
FIG. 7A depicts an exemplary embodiment of an enclosure that may include one or more blank that is located in a computer enclosure, such as with the computer enclosure from FIGS. 6A-6B.
Figure 7B:
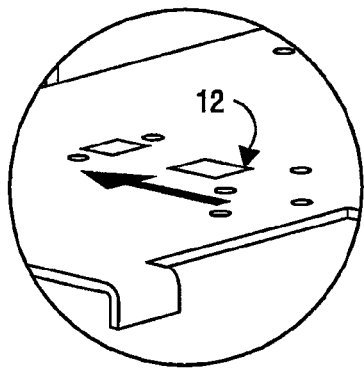
FIG. 7B depicts an exemplary embodiment of the divider 10 that may be utilized as a device bay shelf in the computer enclosure 30, similar to the diagram from FIG. 7A.
Figure 7B:
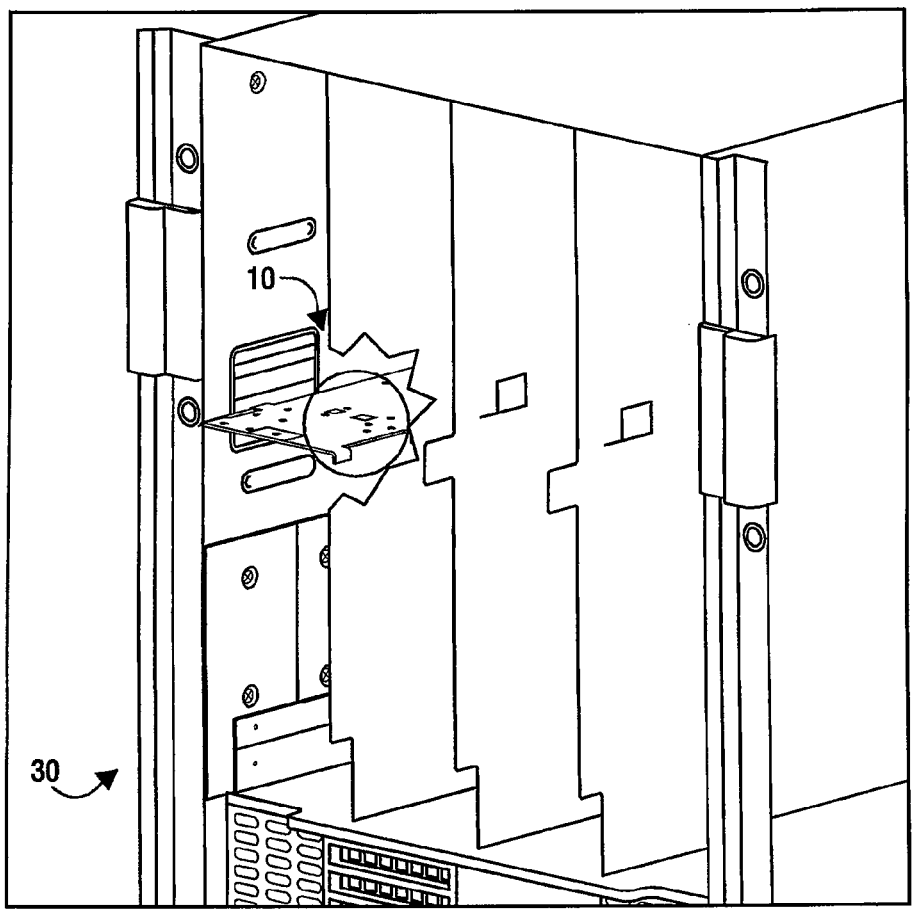
Figure 7C:
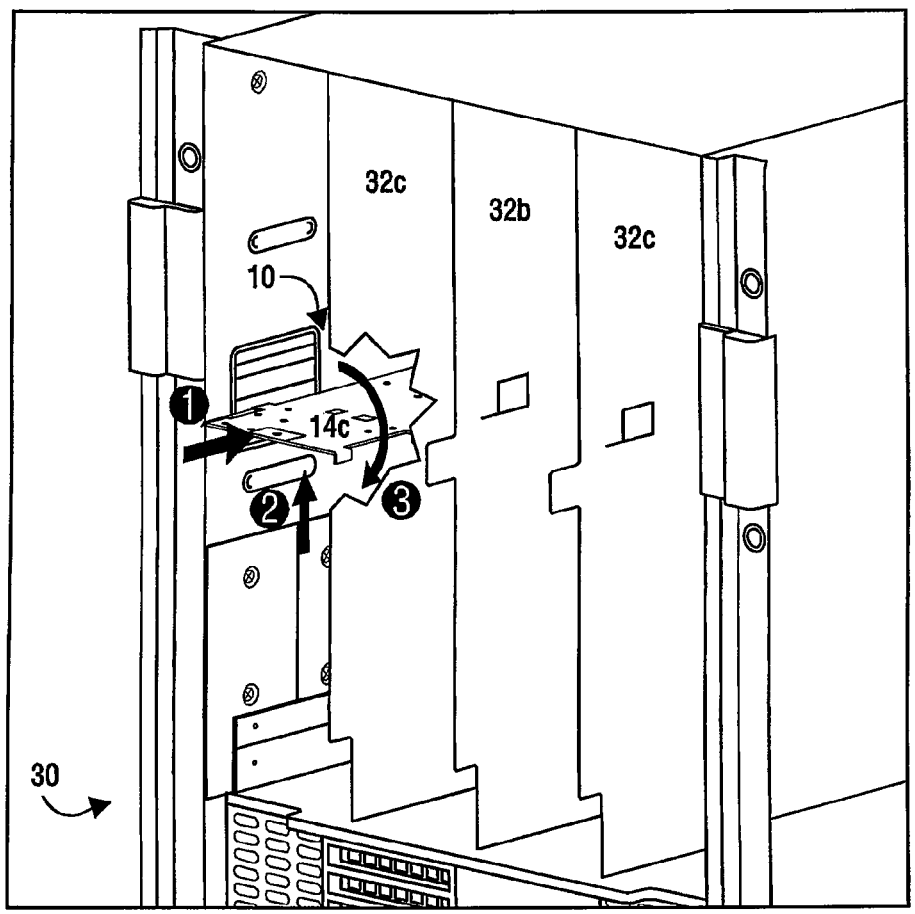
FIG. 7C depicts an exemplary embodiment of the divider 10, which may be removed from the computer enclosure 30, similar to the diagram from FIG. 7B.
Figure 7D:
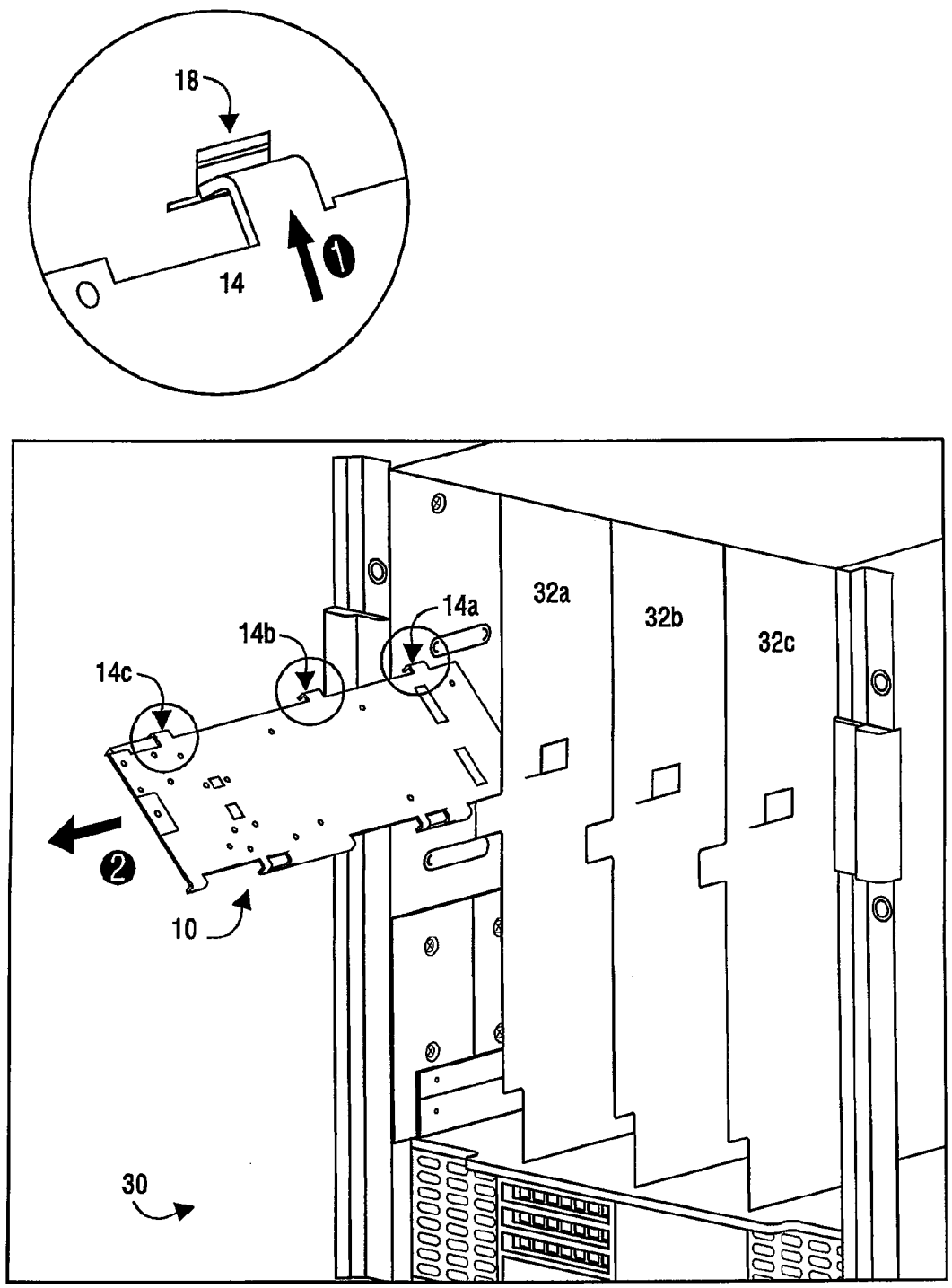

FIG. 7D depicts an exemplary embodiment of the divider 10, further illustrating removal of the divider 10 from the computer enclosure 30, similar to the diagram from FIG. 7C.

Figure 8A:
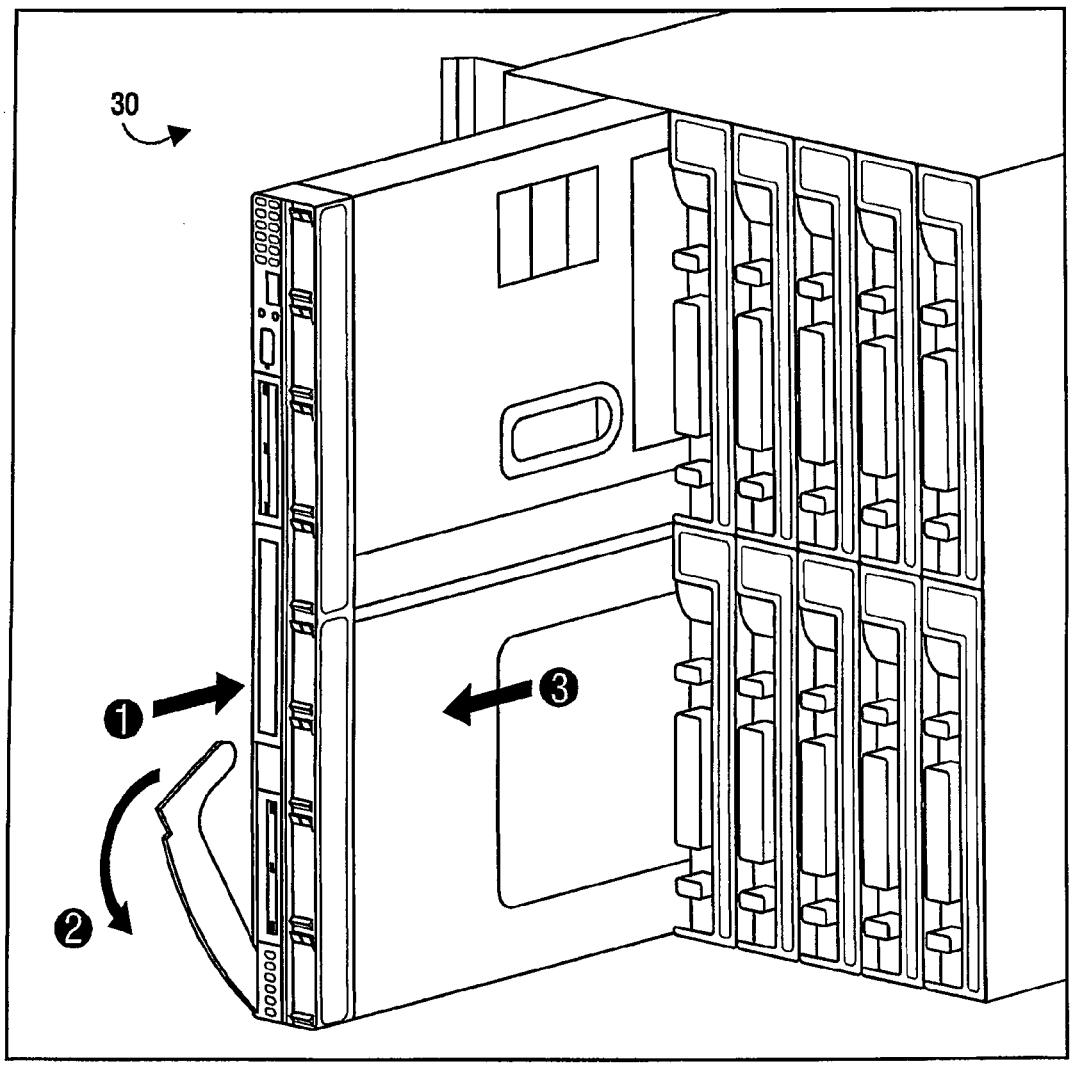

FIG. 8A depicts an exemplary embodiment of the removal of a device from the computer enclosure, similar to the diagram from FIG. 7A.

Figure 8B:
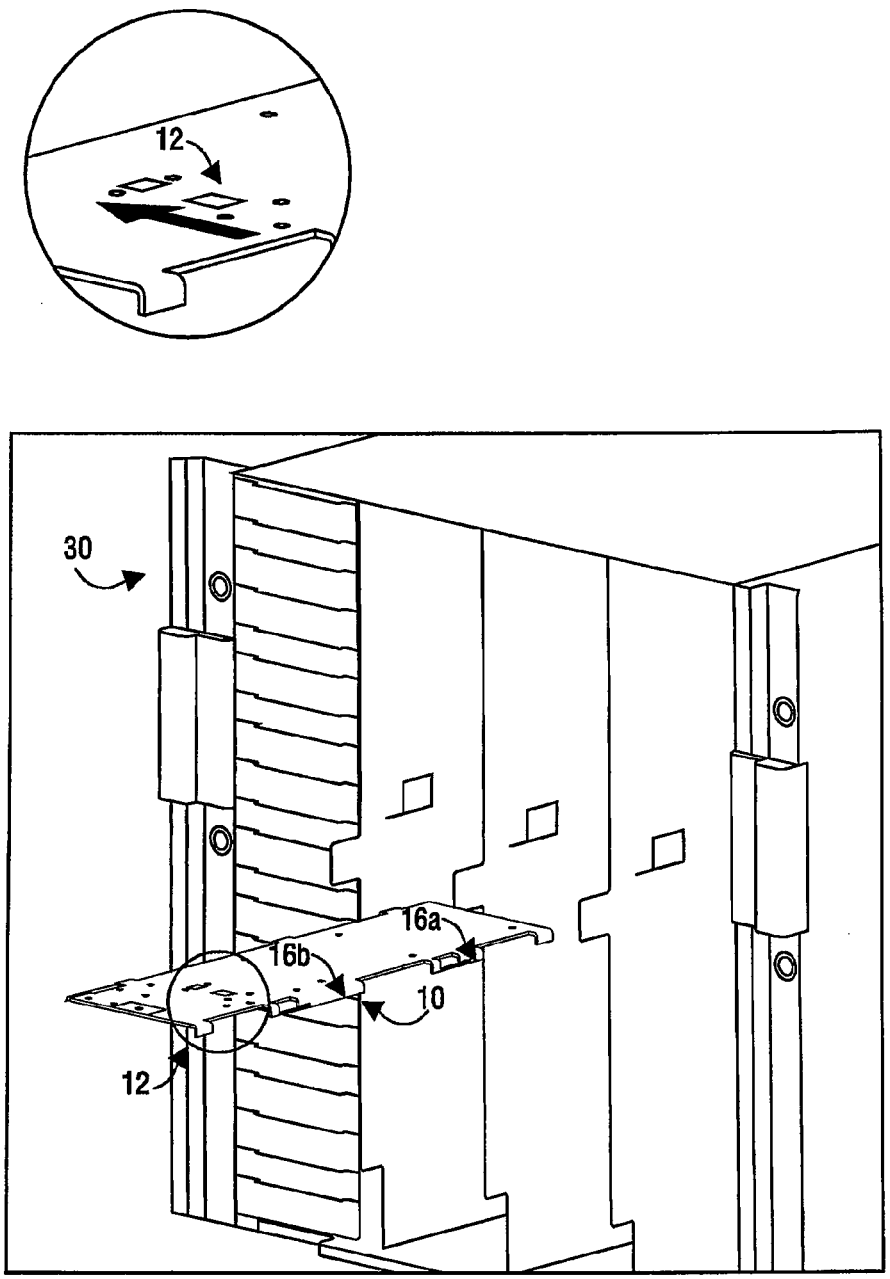

FIG. 8B depicts an exemplary embodiment of the installation of a divider as a device bay shelf, similar to the diagram from FIG. 8A.

Figure 8C:
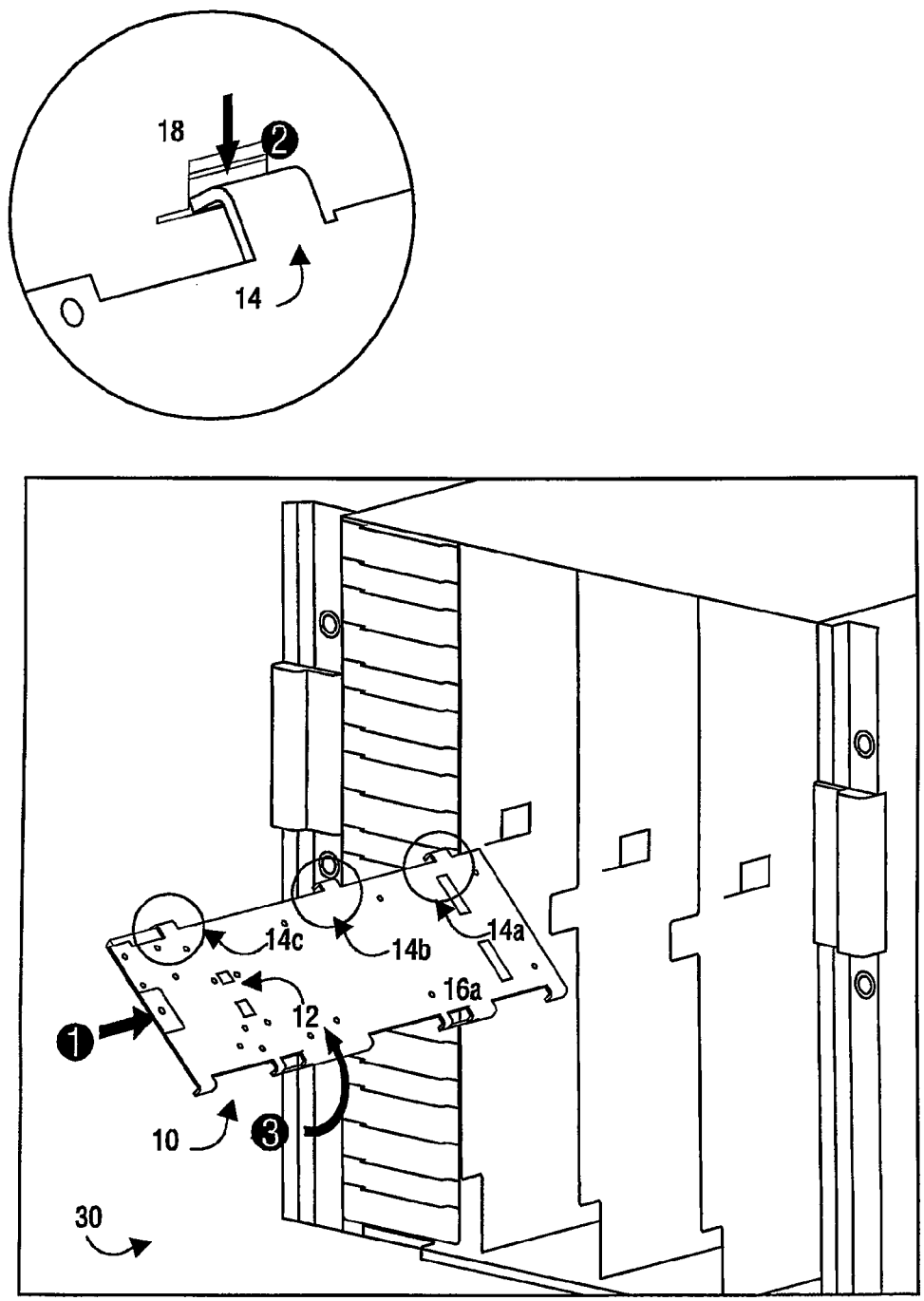

FIG. 8C depicts an exemplary embodiment of the installation of the divider, similar to the diagram from FIG. 8B.

Figure 8D:
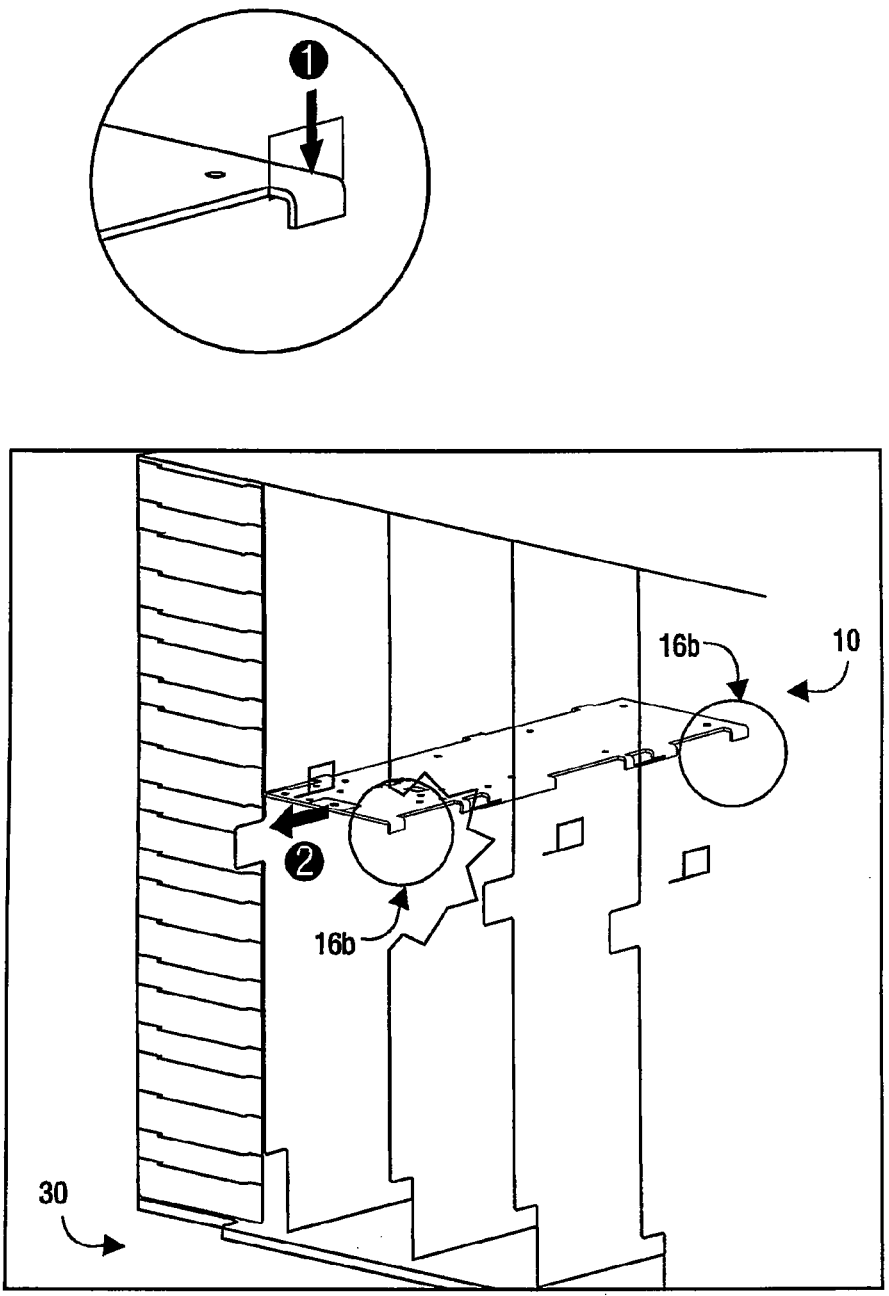

FIG. 8D depicts an exemplary embodiment of pulling the divider from the enclosure to facilitate locking of the divider in the computer enclosure.

Figure 8E:
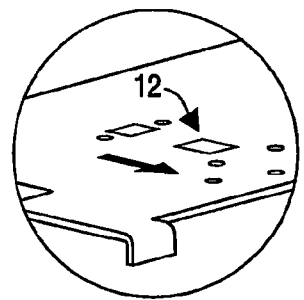
Figure 8E:
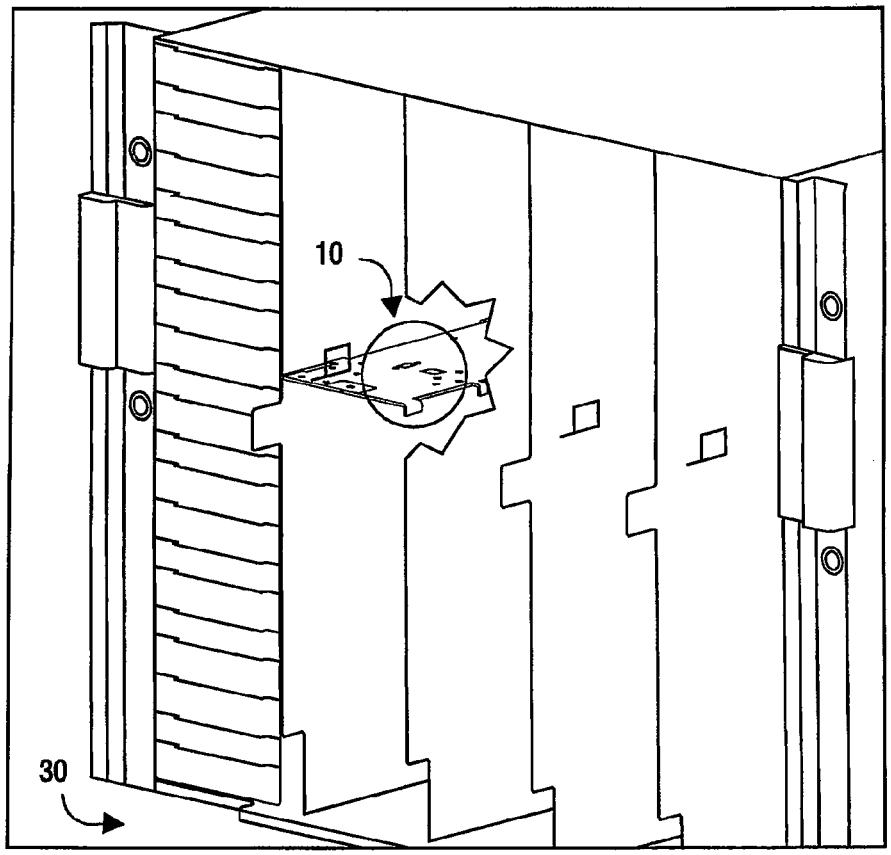

FIG. 8E depicts an exemplary embodiment of securing the divider 10 in the computer enclosure 30, similar to the diagram from FIG. 8D.

Figure 1:
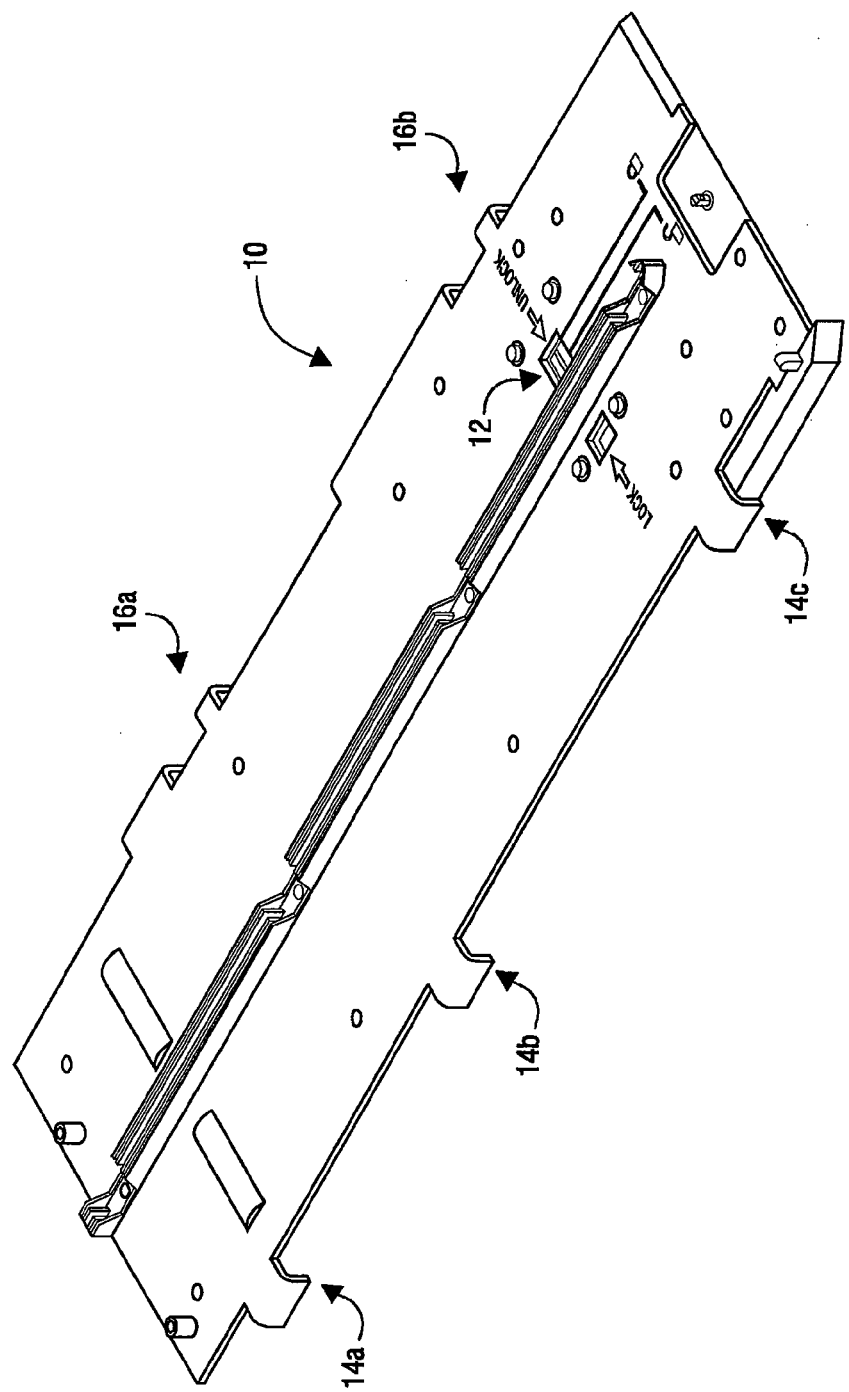
FIG. 1 depicts an exemplary embodiment of a divider.
Figure 9:
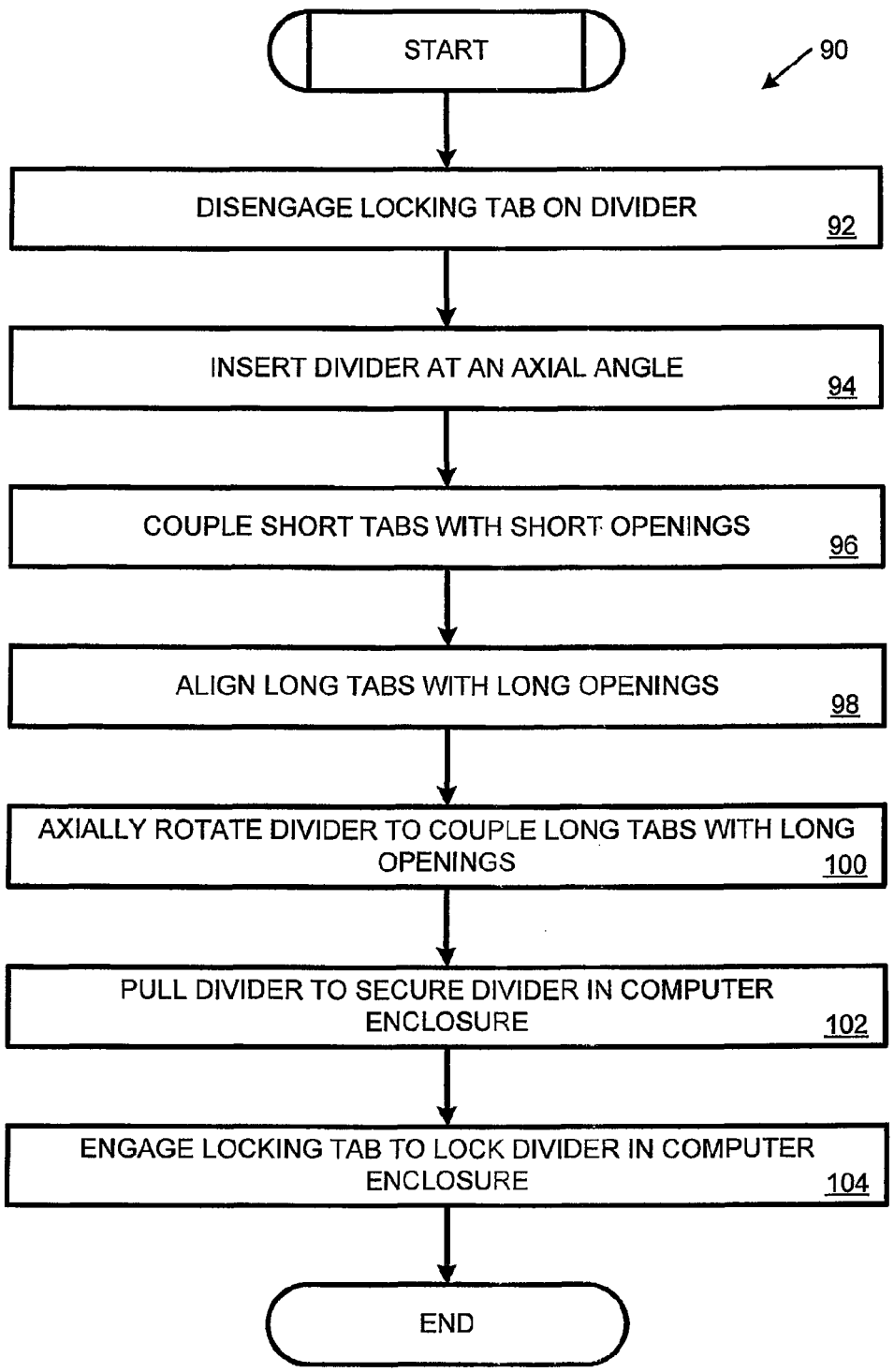

FIG. 9 depicts an exemplary flowchart illustrating a process that may be utilized for locking a divider in a computer enclosure, such as the divider from FIG. 1.

DETAILED DESCRIPTION

Included are embodiments to convert a computer enclosure between the use of full and/or half height blades. Embodiments disclosed herein offer users additional flexibility to configure standard systems to suit their individual needs. By converting two adjacent full-height positions into four half height positions, a user has the option of partially converting the computer enclosure. This allows a computer enclosure, which in some embodiments, may be configured to support eight full height blades, to be converted to support 6 full-height and 4 half-height blades. Conversion can proceed along these lines, two adjacent slots at a time until the entire enclosure supports 16 half-height blades. Additionally, since the conversion is easily reversible, the computer enclosure can be returned to supporting up to 8 full-height blades at any time as the system configuration and/or requirements change.

At least one embodiment of a divider includes a support platform that includes a sheet metal and/or plastic assembly approximately 4 inches wide by 18 inches long and 0.100 inches thick. To allow toolless installation and removal of the divider, the two approximately 14.5 inch tall vertical walls, between which the divider is installed, may include a plurality of openings machined into them. Similarly, in at least one embodiment, three short tabs on the left edge of the platform may be configured to contact three short openings in the leftmost of the two vertical walls. The divider may be configured to then pivot around this contact line to be rotated up on the right side a predetermined amount (e.g., approximately 30°). A user may additionally lift two slotted features (e.g., long tabs) on the right edge to contact mating features (e.g., long openings) on the rightmost wall. The user may then slide the divider forward (e.g., approximately 1 inch) until a stop is reached. At this point the divider may be mechanically secured to the computer enclosure, but to prevent reverse movement, a cross-slide locking mechanism may be pushed laterally about one eighth of an inch into a mating catch in the rightmost wall. This mating catch locks the platform securely into place. Removal of the platform may be achieved by reversing the above described operations. Once securely in place, the divider can support the weight of two half-height blades in the upper half of the computer enclosure and allow sufficient clearance for two more half-height blades to be installed in the lower half. Other embodiments of the divider may be configured for use as a vertical divider between blade servers.

Referring now to the drawings, FIG. 1 depicts an exemplary embodiment of a divider 10. The divider 10 may be configured for dividing an enclosure that houses computer components, such as blade servers. More specifically, the divider 10 may include a locking tab 12 for locking the divider 10 in place within the computer enclosure. Similarly, the divider 10 may include a plurality of short tabs 14a, 14b, and 14c (collectively referred to as "short tabs 14") for attaching the divider 10 to a frame portion of the computer enclosure. Similarly, long tabs 16a and 16b are also included and configured for attaching the divider 10 to the frame portion of the computer enclosure. A top portion of the divider may be configured for slidably receiving a blade server or other computing component while residing in the computer enclosure.

As illustrated in the nonlimiting example of FIG. 1, the locking tab 12 may have a lock position and an unlock position. As discussed in more detail below, after the divider 10 is inserted within the computer enclosure, the locking tab 12 may be engaged to lock the divider 10 in place. Similarly, when removing the divider 12 from its position within the computer enclosure, the locking tab 12 may be set to the unlock position for removal. As also illustrated in FIG. 1, the short tabs 14 may be located on a perimeter portion of the divider 10 and may be "L" shaped, curved, or otherwise configured to facilitate securing the divider 10 within the computer enclosure. Additionally, while not a requirement, in at least one embodiment, the short tabs 14 may be substantially the same size and/or shape.

Figure 2:
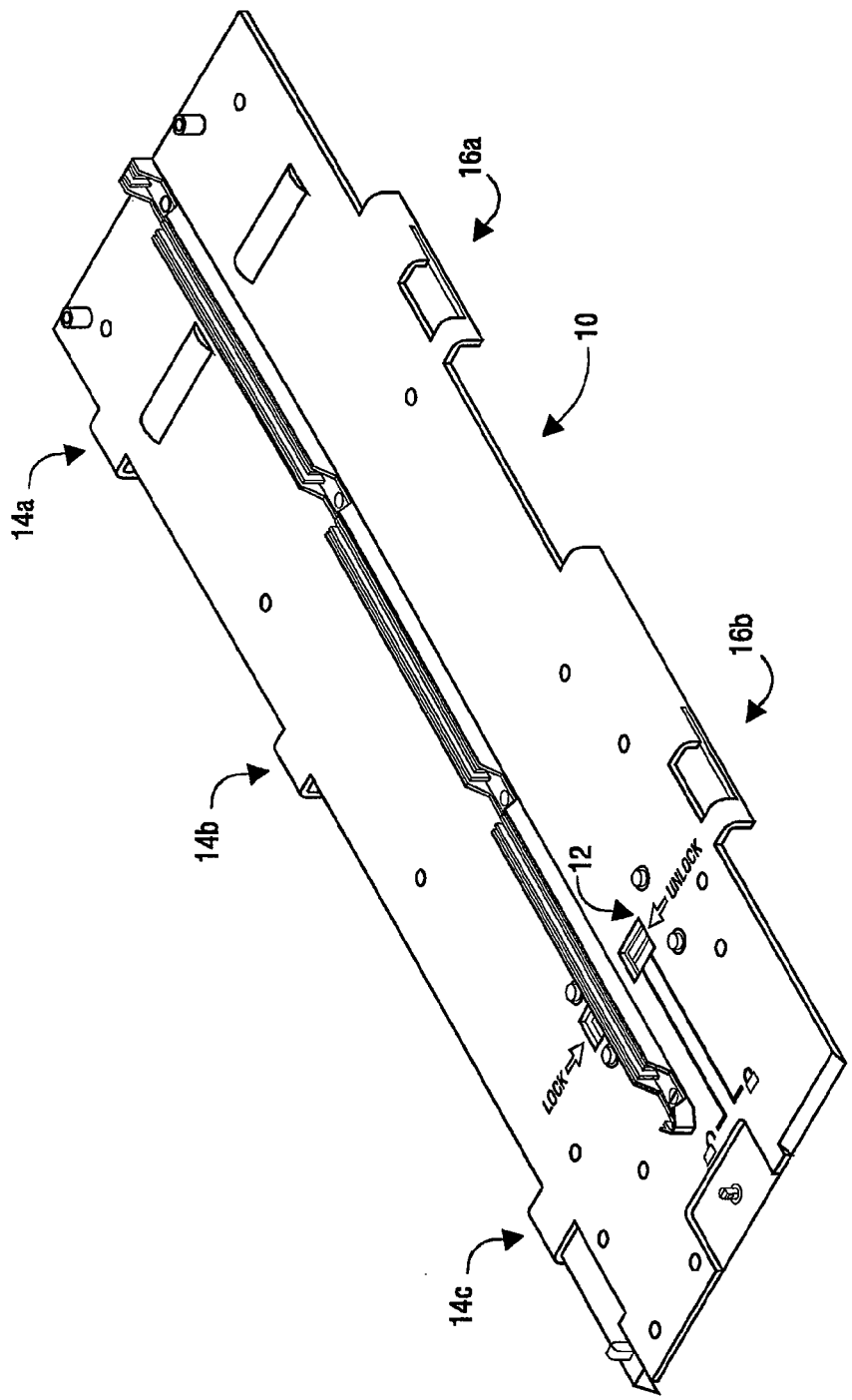
FIG. 2 depicts an additional perspective view of an exemplary embodiment of the divider, similar to the diagram from FIG. 1.

FIG. 2 depicts an additional perspective view of an exemplary embodiment of the divider 10, similar to the diagram from FIG. 1. More specifically, as illustrated in FIG. 1, FIG. 2 includes the divider 10 with the locking tab 12, and short tabs 14. Additionally, the configuration of FIG. 2 illustrates a better perspective of the long tabs 16a and 16b. While long tabs 16a and 16b are illustrated in FIG. 2 as being of different sizes, one should note that this is a nonlimiting example, as the sizes and/or shapes of the long tabs 16 may vary depending on the configuration of the computer enclosure.

Figure 3:
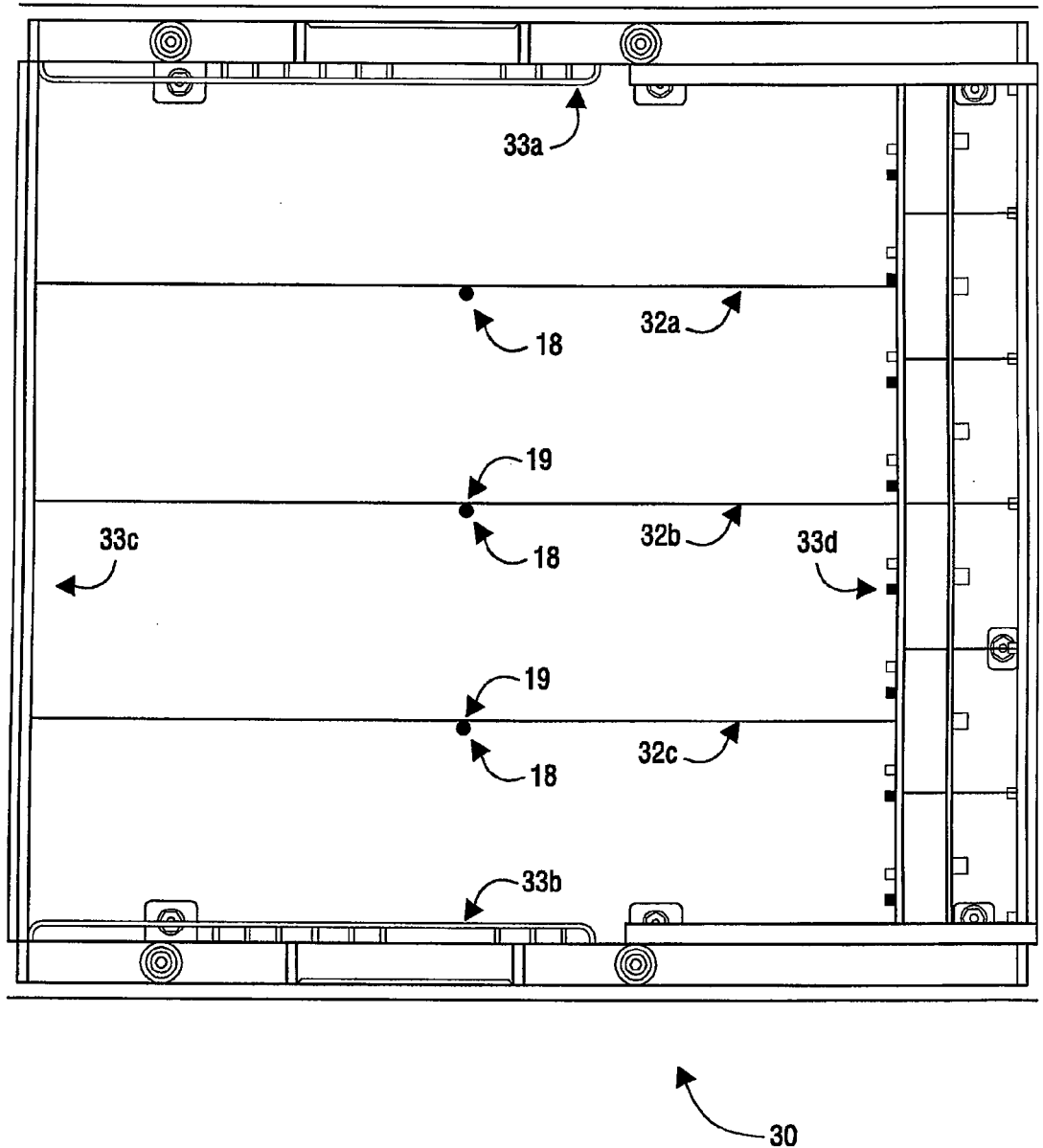
FIG. 3 depicts en exemplary embodiment of a computer enclosure, which may be configured to receive one or more dividers, such as the divider illustrated in FIG. 1.

FIG. 3 depicts en exemplary embodiment of a computer enclosure 30, which may be configured to receive one or more dividers, such as the divider 10, illustrated in FIG. 1. The computer enclosure may include one or more dividing walls 32a, 32b, 32c, each of which may include one or more short openings 18 for receiving the short tabs 14 and/or one or more long openings 19 for receiving the long tabs 16. Additionally, features have been created and attached to two outer walls 33a, 33b, 33c, 33d, which may be configured to replicate the slots and tabs in the dividing walls.

Figure 4:
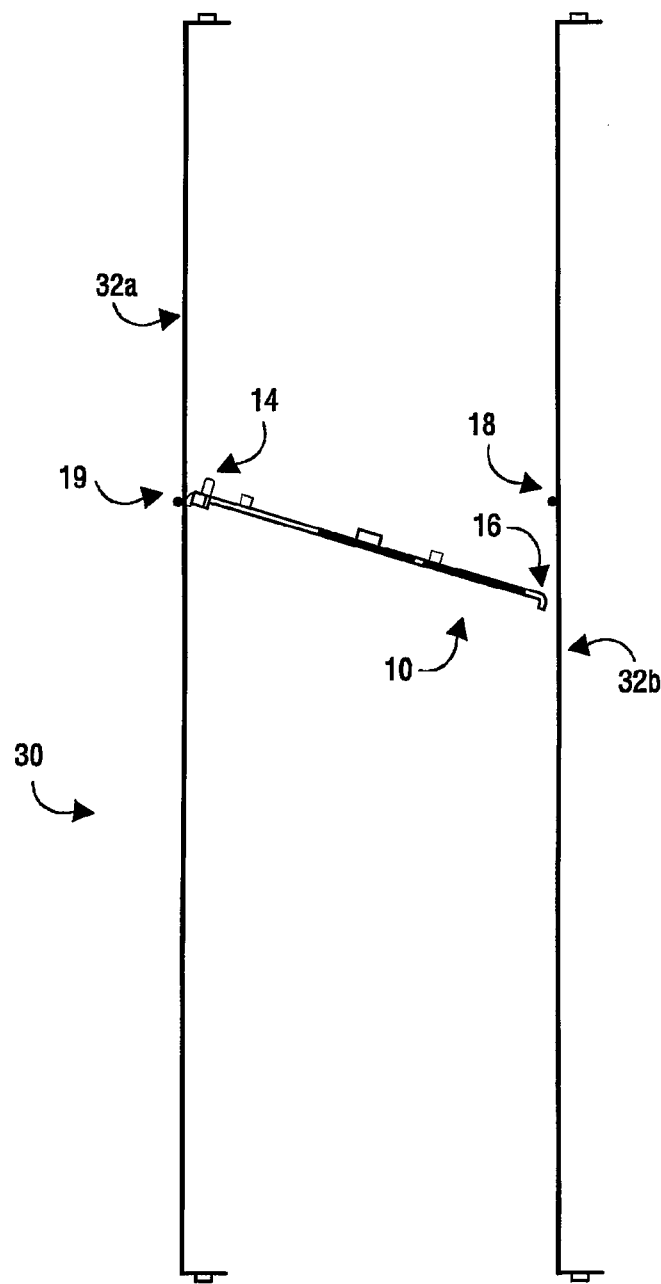
FIG. 4 depicts an exemplary embodiment of a divider being inserted into the computer enclosure.

FIG. 4 depicts an exemplary embodiment of a divider 10 being inserted into the computer enclosure 30. More specifically, as illustrated in FIG. 4, and discussed in greater detail below, the divider 10 may be inserted between two dividing walls 32 at an angle relative to the dividing walls 32. The divider 10 may then be axially rotated to insert the short tabs 14 into the short openings 18. The divider 10 may then be rotated the opposite direction (in this nonlimiting example counter-clockwise) to insert the long tabs 16 into the long openings 19. The divider 10 may then be adjusted and the locking tab may be engaged.

Figure 5:
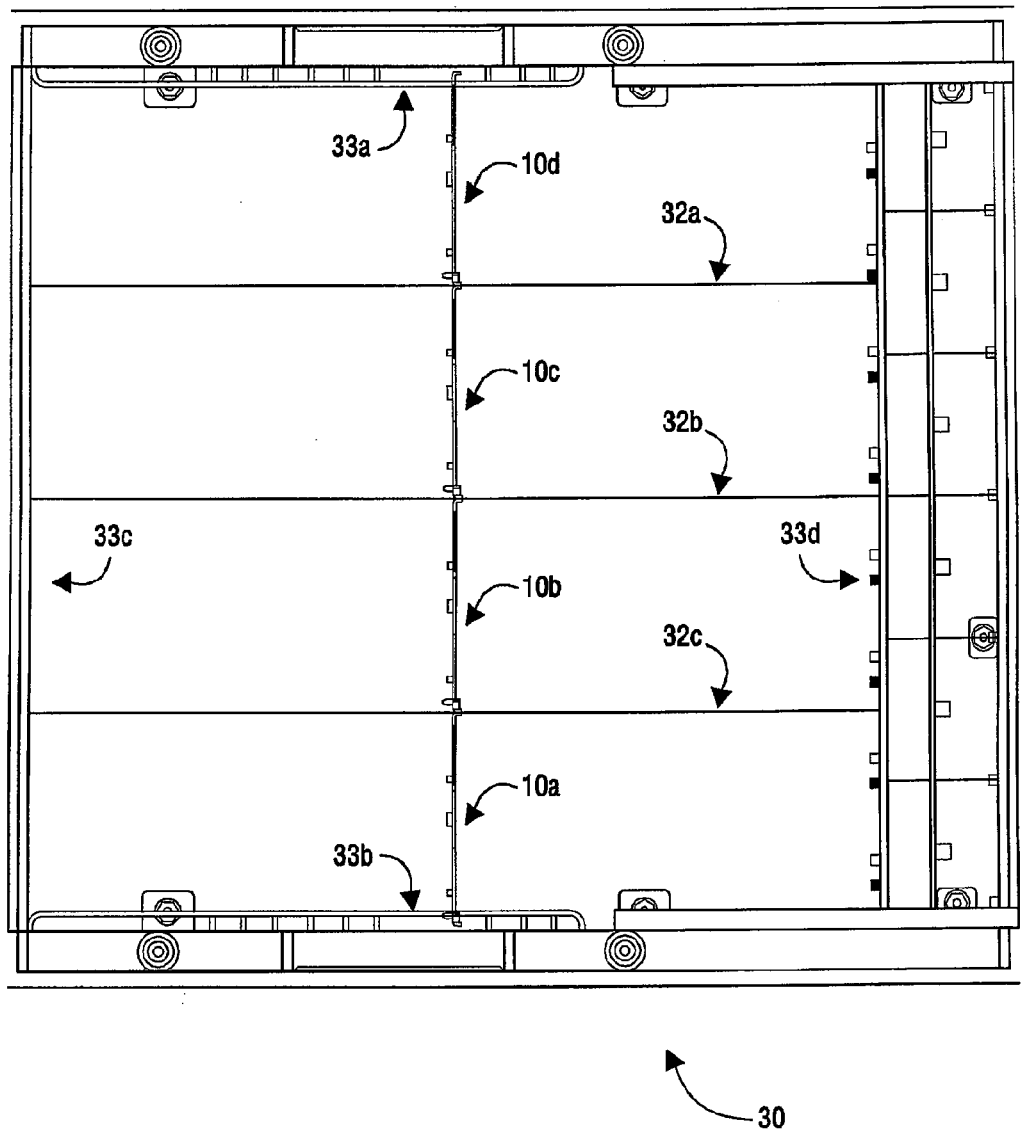
FIG. 5 depicts an exemplary embodiment of the computer enclosure, with dividers inserted between dividing walls.

FIG. 5 depicts an exemplary embodiment of the computer enclosure 30, with dividers 10 inserted between the dividing walls 32. One should note that while nonlimiting example of FIG. 5 illustrates the dividers 10 as being vertical dividers, this is a nonlimiting example, as in at least one embodiment, the dividers may be embodied as horizontal platforms for supporting one or more blade servers.

Figure 6A:
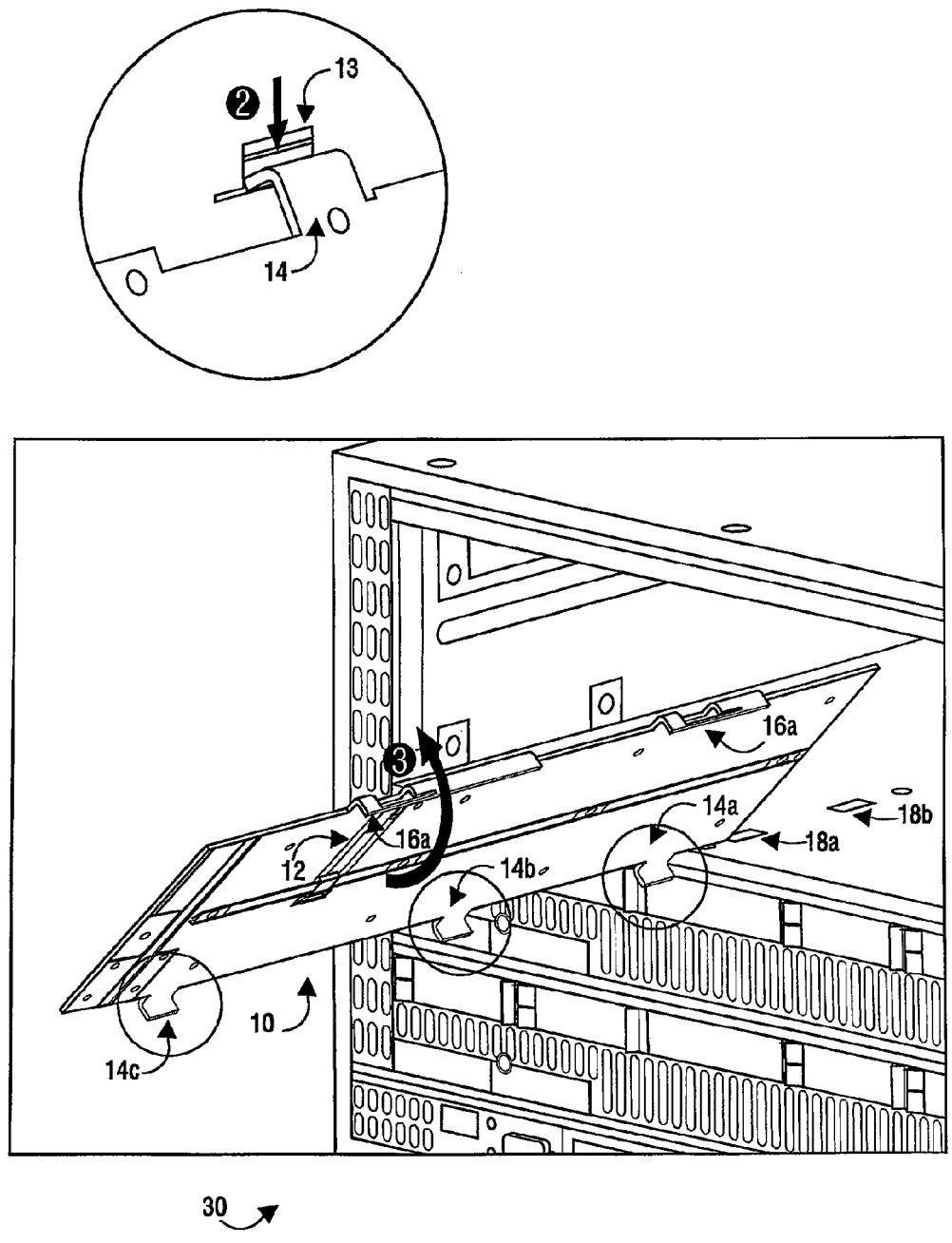
FIG. 6A depicts an exemplary embodiment of the divider being inserted into a computer enclosure, similar to the diagram from FIG. 5.

FIG. 6A depicts an exemplary embodiment of the divider 10 being inserted into a computer enclosure 30, similar to the diagram from FIG. 5. As illustrated in the nonlimiting example of FIG. 6A, the divider 10 is being implemented as a full height vertical divider and may be inserted into the computer enclosure 30 by first disengaging the locking tab 12. The divider 10 may then be rotated clockwise for insertion into the computer enclosure 30. The divider can then be inserted into the computer enclosure 30 such that the short tabs 14 are coupled with the corresponding short openings 18 and the long tabs 16 substantially align with their corresponding long openings 19. Once positioned in this way, the divider 10 may be rotated counter-clockwise such that the long tabs 16 couple with their corresponding long openings 19.

Figure 6B:
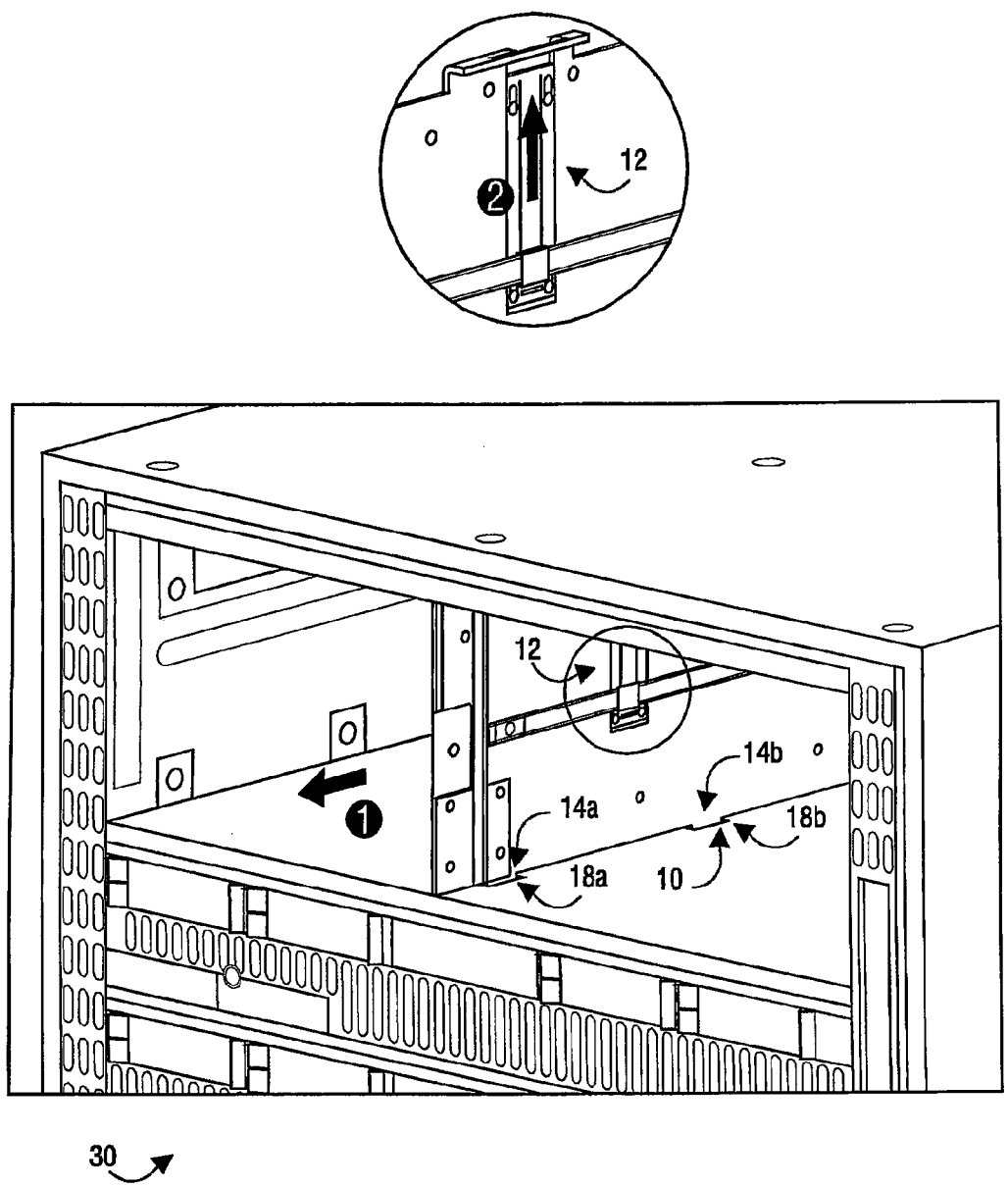
FIG. 6B depicts an exemplary embodiment of a divider being inserted into a computer enclosure, similar to the diagram from FIG. 6A.

FIG. 6B depicts an exemplary embodiment of a divider 10 being inserted into a computer enclosure 30, similar to the diagram from FIG. 6A. As illustrated in the nonlimiting example of FIG. 6B, once the short tabs 14 and long tabs 16 are all coupled with their respective openings 18, 19, the divider 10 may be pulled forward (in the opposite direction of insertion). Because the short tabs 14 are coupled with the short openings 18, and the long tabs 16 are coupled with the long openings 19, the divider 10 may move only a small distance. The locking tab 12 may then be engaged to lock the divider in place.

FIG. 7A depicts an exemplary embodiment of an enclosure that may include one or more blank 70 that is located in a computer enclosure 30, such as with the computer enclosure from FIGS. 6A-6B. As illustrated in the nonlimiting example of FIG. 7A, a blank 70 may be removed from the computer enclosure 30. The blank 70 may be removed by pressing tabs 1 together and pulling outward. By removing one or more blanks 70, space may be freed for insertion of the divider 10.

FIG. 7B depicts an exemplary embodiment of the divider 10 that may be utilized as a device bay shelf in the computer enclosure 30, similar to the diagram from FIG. 7A. More specifically, as illustrated in the nonlimiting example of FIG. 7B, the divider 10 may be securely locked in position, as discussed above. The divider 10 may be removed by first disengaging the locking tab 12.

FIG. 7C depicts an exemplary embodiment of the divider 10, which may be removed from the computer enclosure 30, similar to the diagram from FIG. 7B. Continuing from the diagram from FIG. 7B, after the locking tab 12 is disengaged, the divider 10 may be pushed farther into the computer enclosure 30. Since the short tabs 14 and the long tabs 16 are coupled to the respective openings 18, 19, the divider 10 may move only a small distance. The divider 10 may then be pushed up on the side of the long tabs 16 to disengage the long tabs 16 from the openings 19 in the dividing wall 32a (in the nonlimiting example of FIG. 7C, this is the right side of the divider 10). The divider 10 may then be rotated axially in the opposite direction (in this nonlimiting example, clockwise) to disengage the small tabs 14 from the corresponding small openings 18.

FIG. 7D depicts an exemplary embodiment of the divider 10, further illustrating removal of the divider 10 from the computer enclosure 30, similar to the diagram from FIG. 7C. As illustrated in the nonlimiting example of FIG. 7D, by rotating the divider 10 clockwise, the divider 10 may be disengaged from the small openings 18 and the large openings 19. The divider 10 may then be pulled from the computer enclosure 30.

FIG. 8A depicts an exemplary embodiment of the removal of a device from the computer enclosure 30, similar to the diagram from FIG. 7A. As illustrated in the nonlimiting example of FIG. 8A, a server blade 80 may be removed from the computer enclosure 30. While the nonlimiting example of FIG. 8A illustrates the server blade as a full-height server blade, this is a nonlimiting example, as this device could include a storage blade, a device bay blank, and/or other device.

FIG. 8B depicts an exemplary embodiment of the installation of a divider 10 as a device bay shelf, similar to the diagram from FIG. 8A. As illustrated, once the server blade 80 is removed, the divider 10 may be accessed to disengage the locking tab 12. As discussed above, by disengaging the locking tab 12, the divider may be toollessly inserted into the computer enclosure 30.

FIG. 8C depicts an exemplary embodiment of the installation of the divider 10, similar to the diagram from FIG. 8B. As illustrated in the nonlimiting example of FIG. 8C, the divider 10 may be axially rotated, with the long tabs 16 pointed in the downward direction (in this nonlimiting example, the divider 10 is turned counter clockwise). The divider 10 may then be inserted into the computer enclosure such that the short tabs 14 are coupled with the corresponding short openings 18 and the long tabs 16 are substantially aligned with the long openings 19. The divider may then be pushed upward to couple the long tabs 16 with the corresponding long openings 19.

FIG. 8D depicts an exemplary embodiment of pulling the divider 10 from the enclosure to facilitate locking of the divider 10 in the computer enclosure 30. More specifically, the divider 10 may then be pulled outward from the computer enclosure 30. Because the short tabs 14 are coupled with the short openings 18 and the long tabs 16 are coupled with the long openings 19, the divider 10 may move only a small distance.

FIG. 8E depicts an exemplary embodiment of securing the divider 10 in the computer enclosure 30, similar to the diagram from FIG. 8D. As illustrated in the nonlimiting example of FIG. 8E, after the divider 10 is pulled forward, the locking tab 12 may then be engaged to lock the divider 10 in place.

FIG. 9 depicts an exemplary flowchart 90 illustrating a process that may be utilized for locking a divider in a computer enclosure 30, such as the divider 10 from FIG. 1. As illustrated in the nonlimiting example of FIG. 9, the locking tab 12 can be disengaged (block 92). Additionally, the divider 10 can be inserted into the computer enclosure 30 at an axial angle (block 94). The short tabs 14 may be coupled with the short openings 18 (block 96). Similarly, the long tabs 16 may be aligned with the short openings 19 (block 98). The divider 10 can be axially rotated to couple the long tabs 16 with the long openings 19 (block 100). The divider 10 can be pulled in the direction back out of the computer enclosure (block 102). Additionally, the locking tab 12 may be engaged to lock the divider 10 in the computer enclosure 30 (block 104).

It should also be noted that in some alternative implementations, the functions noted in the flowchart blocks may occur out of the order and/or not at all. For example, two blocks shown in succession may in fact be executed substantially concurrently or the blocks may sometimes be executed in the reverse order, depending upon the functionality involved.

One should also note that conditional language, such as, among others, "scan," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

It should be emphasized that the above-described embodiments are merely possible examples of implementations, merely set forth for a clear understanding of the principles of this disclosure. Many variations and modifications may be made to the above-described embodiment(s) without departing substantially from the spirit and principles of the disclosure. All such modifications and variations are intended to be included herein within the scope of this disclosure.

The invention claimed is:

1. An apparatus comprising:
 a computer enclosure configured to support a plurality of components, the computer enclosure including a plurality of dividing walls, the dividing walls including a plurality of openings; and
 a divider configured for insertion into the computer enclosure and between the dividing walls, the divider including a pair of opposing sides, each side comprising a plurality of tabs that fit into the openings, wherein the tabs on one opposing side are all aligned with a perimeter portion of the other opposing side in between the closer tabs of the other opposing side, and wherein the tabs have a length in a direction parallel to each opposing side, the length of the tabs of one opposing side being different than the length of the tabs of the other opposing side, and wherein the divider further includes a slidable locking tab which slides out of an opening on one of the tabs for locking the divider in place within the computer enclosure;
 wherein said slidable locking tab slides between lock and unlock positions.

2. The apparatus of claim 1, wherein the divider is configured to slidably receive at least one blade server, when residing in the computer enclosure.

3. The apparatus of claim 1, wherein the divider is further configured for at least one of the following:
 toolless insertion into the computer enclosure and toolless removal from the computer enclosure.

4. The apparatus of claim 1, wherein the divider is configured as a vertical divider between components within the computer enclosure.

5. The apparatus of claim 1, wherein the divider is configured as a device platform for supporting at least one component within the computer enclosure.

6. A method comprising: inserting a divider into a computer enclosure at an axial angle, the divider including a pair of opposing sides, each side comprising a plurality of tabs that fit into the openings, wherein the tabs on one opposing side are all aligned with a perimeter portion of the other opposing side in between the closer tabs of the other opposing side, and wherein the tabs have a length in a direction parallel to each opposing side, the length of the tabs of one opposing side being different than the length of the robs of the other opposing side, the computer enclosure including a plurality of openings;

coupling tabs on one opposing side with corresponding openings and aligning the tabs on the other opposing side with corresponding openings; axially rotating the divider to couple the aligned tabs with the corresponding opening; and engaging a slidable locking mechanism with a tab sliding out of an opening on one of the tabs to lock the divider in place within the computer enclosure.

7. The method of claim 6, further comprising, upon coupling the aligned tabs with the corresponding openings, pulling the divider in an outward direction to secure the divider within the computer enclosure.

8. The method of claim 6, further comprising, prior to inserting the divider at an axial angle, disengaging the locking tab.

9. The method of claim 6, wherein the divider is configured as a vertical divider.

10. The method of claim 6, wherein the divider is configured as a device platform for supporting at least one component within the computer enclosure.

\* \* \* \* \*

UNITED STATES PATENT AND TRADEMARK OFFICE
CERTIFICATE OF CORRECTION

| | | |
|---|---|---|
| PATENT NO. | : 8,982,565 B2 | Page 1 of 1 |
| APPLICATION NO. | : 12/121350 | |
| DATED | : March 17, 2015 | |
| INVENTOR(S) | : David W. Sherrod et al. | |

It is certified that error appears in the above-identified patent and that said Letters Patent is hereby corrected as shown below:

Claims

In column 7, line 15, in Claim 6, delete "robs" and insert -- tabs --, therefor.

Signed and Sealed this
Thirteenth Day of October, 2015

Michelle K. Lee
*Director of the United States Patent and Trademark Office*